US012009430B2

United States Patent
Voronin et al.

(10) Patent No.: US 12,009,430 B2
(45) Date of Patent: Jun. 11, 2024

(54) METHOD FOR GATE STACK FORMATION AND ETCHING

(71) Applicant: Tokyo Electron Limited, Tokyo (JP)

(72) Inventors: Sergey Voronin, Albany, NY (US);
Christopher Catano, Albany, NY (US);
Sang Cheol Han, Albany, NY (US);
Shyam Sridhar, Albany, NY (US);
Yusuke Yoshida, Albany, NY (US);
Christopher Talone, Albany, NY (US);
Alok Ranjan, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 587 days.

(21) Appl. No.: 16/782,680

(22) Filed: Feb. 5, 2020

(65) Prior Publication Data

US 2020/0273992 A1    Aug. 27, 2020

Related U.S. Application Data

(60) Provisional application No. 62/808,916, filed on Feb. 22, 2019.

(51) Int. Cl.
*H01L 29/78*    (2006.01)
*H01L 21/02*    (2006.01)
(Continued)

(52) U.S. Cl.
CPC .... *H01L 29/7851* (2013.01); *H01L 21/02252* (2013.01); *H01L 21/3065* (2013.01); *H01L 21/32139* (2013.01); *H01L 29/66795* (2013.01)

(58) Field of Classification Search
CPC ..... H01L 21/823431; H01L 21/823821; H01L 21/845; H01L 27/0886; H01L 27/0924;
(Continued)

(56) References Cited

U.S. PATENT DOCUMENTS 7,816,275 B1    10/2010  Fuller et al.
2004/0129975 A1*  7/2004  Koh .................. H01L 29/78621
                                                    257/E21.415
(Continued)

FOREIGN PATENT DOCUMENTS

JP    2004-253792   *  1/2004  ............. H01L 29/78
JP    2007201320      8/2007
KR    20020009112     2/2002

OTHER PUBLICATIONS

International Search Report And The Written Opinion, International Filing Date Feb. 5, 2020, Application No. PCT/US2020/016801, Date of Mailing Jun. 10, 2020, 9 pgs.

(Continued)

*Primary Examiner* — Kevin Parendo
(74) *Attorney, Agent, or Firm* — Egan, Enders & Huston LLP.

(57) ABSTRACT

Residue at the base of a feature in a substrate to be etched is limited so that improved profiles may be obtained when forming vertical, narrow pitch, high aspect ratio features, for example fin field effect transistor (FinFET) gates. A thin bottom layer of the feature is formed of a different material than the main layer of the feature. The bottom material may be comprised of a material that preferentially etches and/or preferentially oxidizes as compared to the main layer. The bottom layer may comprise silicon germanium. The preferential etching characteristics may provide a process in which un-etched residuals do not remain. Even if residuals remain, after etch of the feature, an oxidation process may be performed. Enhanced oxidation rates of the bottom material allow any remaining residual to be oxidized. Plasma oxidation may be used. The oxidized material may then be removed by utilizing standard oxide removal mechanisms.

10 Claims, 7 Drawing Sheets

(51) Int. Cl.
  *H01L 21/3065* (2006.01)
  *H01L 21/3213* (2006.01)
  *H01L 29/66* (2006.01)
(58) Field of Classification Search
  CPC ......... H01L 27/10826; H01L 27/10879; H01L 27/1211; H01L 29/41791; H01L 29/66795–66818; H01L 29/785–7856; H01L 2029/7857–7858
  See application file for complete search history.

(56) References Cited

U.S. PATENT DOCUMENTS

| | | |
|---|---|---|
| 2006/0091428 A1 | 5/2006 | Yeo et al. |
| 2009/0170267 A1 | 7/2009 | Shah et al. |
| 2012/0261714 A1* | 10/2012 | Taketani ............. H01L 29/7808 257/E29.198 |
| 2013/0005103 A1 | 1/2013 | Liu et al. |
| 2014/0110755 A1* | 4/2014 | Colinge ............ H01L 29/66795 257/E21.409 |
| 2016/0379870 A1* | 12/2016 | Clark ................ H01L 21/31122 438/694 |
| 2019/0189425 A1* | 6/2019 | Thorum ............ H01L 21/02057 |

OTHER PUBLICATIONS

International Preliminary Report, International Filing Date Feb. 5, 2020, Application No. PCT/US2020/016801, Date of Mailing Sep. 2, 2021, 6 pgs.

Voronin et al., "Method For Gate Stack Formation And Etching", Application No. 10-2021-7027110, Korea Office Action mailed Mar. 8, 2024, 15 pgs.

* cited by examiner

METHOD FOR GATE STACK FORMATION AND ETCHING

This application claims priority to U.S. Provisional Patent Application No. 62/808,916, entitled, "Method For Gate Stack Formation and Etching" filed Feb. 22, 2019; the disclosure of which is expressly incorporated herein, in its entirety, by reference.

BACKGROUND

The present disclosure relates to the processing of substrates. In particular, it provides a method for forming high aspect ratio structures.

The use of plasma systems for the processing of substrates has long been known. For example, plasma etch processing of substrates is well known. Historically, plasma etching systems have been utilized to provide selective anisotropic etching techniques. Further, as critical dimensions of features formed on substrates continue to shrink, etching vertically without tapered sidewalls has become more critical. Various factors affect the feature profile including ion energy and angular distribution, radical and ion flux, etch byproduct re-deposition, mask erosion, etc. Resulting etch profiles may still be non-ideal. Further, typically improving the verticality of etch profiles may be achieved at the expense of un-etched residues ("footing," "stringers," etc.) at the bottom of the feature being formed. These un-etched areas may be removed by using more aggressive etching conditions, however the sidewall profiles may be compromised when doing so.

The formation of un-etched residues is particularly problematic in narrow featured high aspect ratio structures. One such structure is the gate of a fin field effect transistor (FinFET). One exemplary common material for forming a FinFET gate is silicon. Narrow, high aspect ratio silicon FinFET gates may etched with an underlying etch stop layer. The etch stop layer may be for example, but is not limited to, silicon nitride, silicon oxide, or other materials for which a desirable etch selectivity between the gate material and the etch stop layer may be achieved. However, when achieving a vertical gate sidewall profile, gate residue (for example silicon) may remain at the base of the gate. In a FinFET structure, such residue may result in the loss of device encapsulation and other defects which may impact the operation and electrical characteristics of the FinFET.

FIGS. 1A-1C illustrate an exemplary FinFET gate formation process having problematic residues formed at the base of the FinFET gate. As shown in FIG. 1A, a substrate structure 100 is provided. The substrate structure 100 includes a patterned mask layer 105. The patterned mask layer may be formed of any of a wide variety of known substrate patterning techniques, for example including but not limited to photolithography techniques. The patterned mask layer may comprise any of a wide range of materials including hard masks, dielectrics, photo resist, other lithography layers, etc. as is well known in the art. Further, the patterned mask layer may be formed of multiple layers of the same or different materials, again as is well known in the art. Underlying the patterned mask layer is a gate layer 110 which will form the FinFET gate. The gate layer 110 may be formed of a variety of materials. One well known FinFET gate material comprises silicon. An etch stop layer 115 may underlie the gate layer 110. The etch stop layer 115 may be formed on a variety of underlying layer(s) 120 which may also include the substrate base, again as is well known in the art. In one embodiment, the underlying layer(s) 120 may merely be a base substrate structure such as silicon or a silicon on insulator (SOI). It will be recognized that additional layers may be formed between the various layers shown in FIGS. 1A-1C as such figures are merely exemplary layers of an exemplary FinFET structure. FIG. 1B illustrates the substrate structure 100 having gates 112 formed by performing a gate etch of the gate layer 110 while using the patterned mask layer 105 as a mask and the etch stop layer 115 as an etch stop. As shown in the cross-section of FIG. 1B, the fin oxide 125 and fins 130 (both in the depth of the page of the cross-section shown) are illustrated. As seen in FIG. 1B, at the base of the gates 112, residue 135 may result as described above. In the example of a silicon gate layer, the residue may comprise silicon.

In one embodiment, it would be desirable to provide a method of forming vertical, narrow pitch, high aspect ratio structures without the formation of residues at the base of the structures. In another embodiment, it would be desirable to form FinFET gates comprised of silicon without having residue silicon at the base of the FinFET gate.

SUMMARY

The techniques described herein provide a process structure and method of limiting residue at the base of a feature to be etched. In one embodiment, the feature to be etched is formed of a multi-layer structure. A thin bottom layer of the feature is formed of a different material than the main layer of the feature. The bottom layer material may be comprised of a material that preferentially etches and/or preferentially oxidizes as compared to the main layer. The preferential etching characteristics may provide a process in which un-etched residuals do not remain. Even if residuals remain (or to provide more process margin in general), after etch of the feature to be formed, an oxidation process may optionally be performed. The enhanced oxidation rates of the bottom material beneficially allow any remaining residual to be oxidized. Further, the oxidation process may be controlled to perform more oxidation at the bottom areas of the feature as compared to vertical sidewalls of the feature via plasma oxidation techniques. The oxidized material may then be removed by utilizing standard oxide removal mechanisms (including, in one example, a wet etch process such as a diluted hydrofluoric (HF) acid etch). In this manner, two mechanisms to remove residues may occur: enhanced etching of the bottom layer and enhanced oxidation of the residuals that remain. The two mechanisms may be utilized in combination or independently.

In one embodiment, the techniques disclosed herein provide an improved method of etching narrow, high aspect ratio structures on a substrate such as a FinFET gate. The FinFET gate may be formed by an upper layer and a bottom layer, the bottom layer being relatively thinner as compared to the upper layer. In one embodiment, the upper layer may comprise silicon. In one embodiment, the bottom layer may comprise a silicon germanium ($Si_{1-x}Ge_x$). The FinFET gate may be etched with a halogen based etch which exhibits a higher etch rate for the $Si_{1-x}Ge_x$ as compared to the silicon layer. The preferential etching of the $Si_{1-x}Ge_x$ helps prevent and/or limit leaving remnant residual gate material at the bottom areas of the FinFET gate. An additional oxidation step may also be utilized to further remove any remaining residues. The oxidation process may include the use of energetic oxygen ions formed in a plasma process. As $Si_{1-x}Ge_x$ exhibits enhanced oxidation versus silicon, residual $Si_{1-x}Ge_x$ of the bottom layer will oxidize more than the silicon sidewalls of the upper layer of the FinFET gate.

Further, the directional nature of the oxygen ions of the oxygen plasma may also be controlled to provide enhanced oxidation of bottom exposed residuals as opposed to vertical sidewalls of the FinFET gate. The oxidized residual material may then be removed by utilizing standard oxide removal mechanisms (including, in one example, a wet etch process such as a diluted hydrofluoric acid etch). The oxidation process may be advantageously utilized even in process flows in which the FinFET gate etch process does not exhibit a preferential etch between the upper layer (for example silicon) and the bottom layer (for example $Si_{1-x}Ge_x$). In this manner, an improved integrated process flow for forming FinFET gates is provided through the use of a separate bottom layer for inclusion in the FinFET gate and (1) use of a gate etch that exhibits enhanced etching of the bottom layer and/or (2) use of an additional oxidation step which preferential oxidizes residuals (either through the oxidation rate differences of the two layers and/or control of the oxidation process to enhance oxidation at the base of the gate as opposed to vertical sidewalls of the gate).

In a first method embodiment, a method of patterning a gate structure on a substrate is disclosed. The first method may comprise providing a patterned mask layer on the substrate, the patterned mask layer corresponding to a gate pattern and providing an upper gate layer underlying the patterned mask layer. The first method also comprises providing a bottom gate layer underlying the upper gate layer, the upper gate layer and the bottom gate layer comprising different materials and plasma etching the upper gate layer and the bottom gate layer to form the gate pattern in the upper gate layer and the bottom gate layer. The bottom gate layer etches faster than the upper gate layer so that residues of the gate structure at the bottom of the gate structure are lessened.

Embodiments of the first method include wherein the gate structure is a fin field effect transistor (FinFET) gate. The bottom layer may comprise silicon germanium ($Si_{1-x}Ge_x$). The upper gate layer may comprise silicon. The plasma etching of the upper gate layer and the bottom gate layer may be performed by a halogen based plasma etch. Embodiments of the first method may further comprise, after plasma etching the upper gate layer and the bottom gate layer, oxidizing residues of the gate structure with a plasma oxidation process to form oxide compounds. Further embodiments may comprise removing the oxide compounds with a wet oxide etch.

In a second method embodiment, a method of patterning a gate structure on a substrate is disclosed. The method may comprise providing a patterned mask layer on the substrate, the patterned mask layer corresponding to a gate pattern; providing an upper gate layer underlying the patterned mask layer; and providing a bottom gate layer underlying the upper gate layer, the upper gate layer and the bottom gate layer comprising different materials. The method further comprises plasma etching the upper gate layer and the bottom gate layer to form the gate pattern in the upper gate layer and the bottom gate layer, and after plasma etching the upper gate layer and the bottom gate layer, oxidizing residues of the gate structure with to form oxide compounds.

Embodiments of the second method include the gate structure being a fin field effect transistor (FinFET) gate. The bottom layer may comprise silicon germanium ($Si_{1-x}Ge_x$). The upper gate layer may comprise silicon. The oxide compounds may be formed with a plasma oxidation. The second method may further comprise removing the oxide compounds. The oxide compounds may be removed with a wet etch.

In a structure embodiment, a substrate structure is disclosed. The substrate structure may comprise a fin field effect transistor (FinFET) gate. The FinFET gate may comprise an upper gate layer, and a bottom gate layer, the bottom gate layer comprising silicon germanium ($Si_{1-x}Ge_x$), the upper gate layer and the bottom gate layer being formed of different materials. An etch stop layer underlying the bottom gate layer is also provided.

Embodiments of the substrate structure include the upper gate layer comprising silicon. The bottom gate layer may be less than 50 nm thick in one embodiment and less than 20 nm thick in another embodiment. The substrate structure may have a ratio of silicon to germanium in the $Si_{1-x}Ge_x$ where 0<X<1 and in one embodiment where 0.1<X<0.4.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Figure 1A:
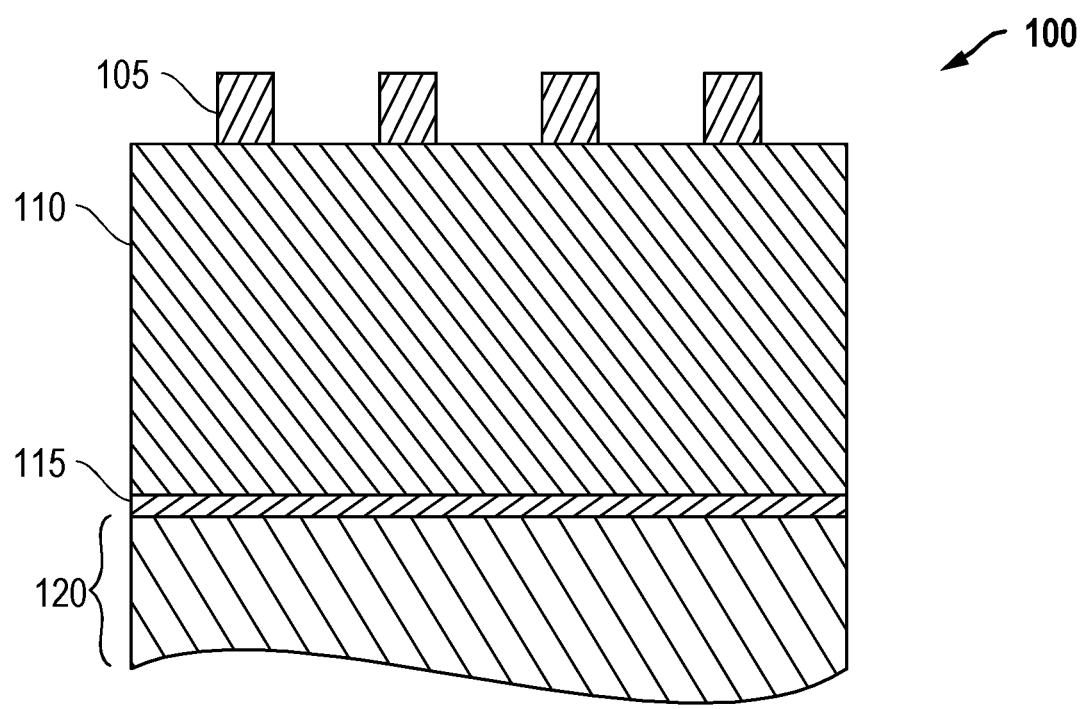
FIGS. 1A-1C illustrate an exemplary prior art FinFET gate formation process exhibiting un-etch residues at the base of the FinFET gate.

The techniques described herein provide a process structure and method of limiting residue at the base of a feature to be etched. In one embodiment, the feature to be etched is formed of a multi-layer structure. A thin bottom layer of the feature is formed of a different material than the main layer of the feature. The bottom layer material may be comprised of a material that preferentially etches and/or preferentially oxidizes as compared to the main layer. The preferential etching characteristics may provide a process in which un-etched residuals do not remain. Even if residuals remain (or to provide more process margin in general), after etch of the feature to be formed, an oxidation process may optionally be performed. The enhanced oxidation rate of the bottom material beneficially allows any remaining residual to be oxidized. Further, the oxidation process may be controlled to perform more oxidation at the bottom areas of the feature as compared to vertical sidewalls of the feature via plasma oxidation techniques. The oxidized material may then be removed by utilizing standard oxide removal mechanisms (including, in one example, a wet etch process such as a diluted hydrofluoric (HF) acid etch). In this manner, two mechanisms to remove residues may occur: enhanced etching of the bottom layer and enhanced oxidation of the residuals that remain. The two mechanisms may be utilized in combination or independently.

In one embodiment, the techniques disclosed herein provide an improved method of etching narrow, high aspect ratio structures on a substrate such as a FinFET gate. As is well known in the art, a FinFET is a type of nonplanar field effect transistor. It will be recognized that the particular structures being formed and process flow shown in the figures are merely exemplary. The FinFET gate may be formed by an upper layer and a bottom layer, the bottom layer being relatively thinner as compared to the upper layer. In one embodiment, the upper layer may comprise silicon. In one embodiment, the bottom layer may comprise a silicon germanium compound ($Si_{1-x}Ge_x$). The FinFET gate may be etched with a halogen based etch which exhibits a higher etch rate for the $Si_{1-x}Ge_x$ as compared to the silicon layer. The preferential etching of the $Si_{1-x}Ge_x$ helps limit or prevent leaving remnant residual gate material at the bottom areas of the FinFET gate. An additional oxidation step may also be utilized to further remove any remaining residues. The oxidation process may include the use of energetic oxygen ions formed in a plasma process. As $Si_{1-x}Ge_x$ exhibits enhanced oxidation versus silicon, residual $Si_{1-x}Ge_x$ of the bottom layer will oxidize more than the silicon sidewalls of the upper layer of the FinFET gate. Further, the directional nature of the oxygen ions of the oxygen plasma may also be controlled to provide enhanced oxidation of bottom exposed residuals as opposed to vertical sidewalls of the FinFET gate. The oxidized residual material may then be removed by utilizing standard oxide removal mechanisms (including, in one example, a wet etch process such as a diluted hydrofluoric acid etch). The oxidation process may be advantageously utilized even in process flows in which the FinFET gate etch process does not exhibit a preferential etch between the upper layer (for example silicon) and the bottom layer (for example $Si_{1-x}Ge_x$). In this manner, an improved integrated process flow for forming FinFET gates is provided through the use of a separate bottom layer for inclusion in the FinFET gate and (1) use of a gate etch that exhibits enhanced etching of the bottom layer and/or (2) use of an additional oxidation step which preferential oxidizes residuals (either through the oxidation rate differences of the two layers and/or control of the oxidation process to enhance oxidation at the base of the gate as opposed to vertical sidewalls of the gate).

Figure 2A:
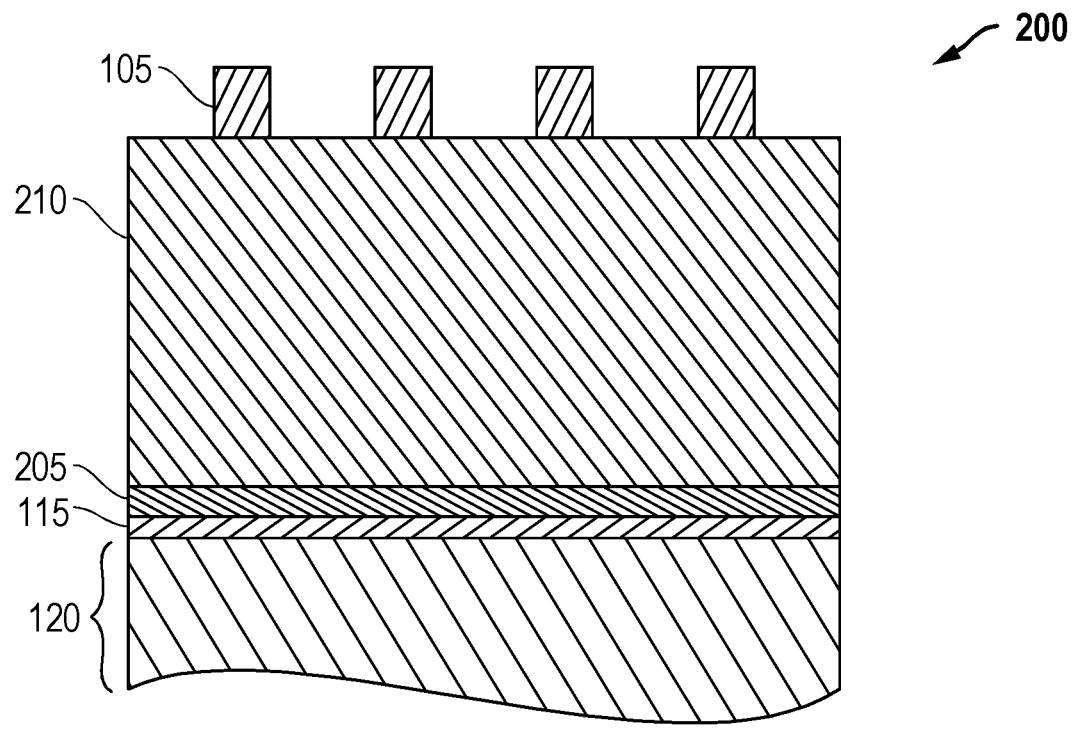
FIGS. 2A-2B illustrate one embodiment of a FinFET gate formation process utilizing the techniques disclosed herein.
Figure 2B:
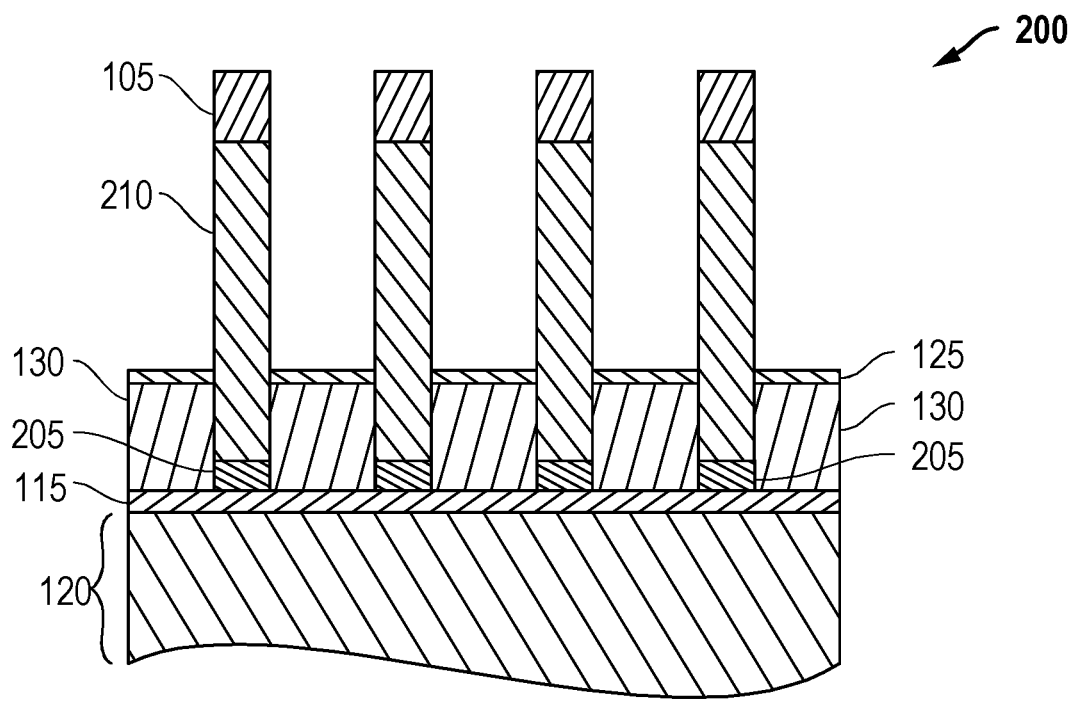

FIGS. 2A-2B illustrate an exemplary structure and process in which one embodiment of the concepts described herein may be incorporated. As shown in FIG. 2A, a substrate structure 200 is provided. The patterned mask layer 105 may be any of a wide range of masking layers known in the substrate processing art. For example, the patterned mask layer 105 may be a photolithography layer, such as for example photoresist. The patterned mask layer 105 may also be a hard mask layer, for example a dielectric layer. The patterned mask layer 105 may alternatively be other types of mask layers. In the example shown, the mask layer features are shown as being a single material, however, it will be recognized that the patterned mask layer of the substrate may be formed of multiple materials or multiple layers of materials. Further, it will be recognized that a substrate on which the various layers are formed may include an underlying layer(s) 120 formed of a single layer or may be formed of many layers and other features not shown which would comprise together the underlying layer(s) 120, all is would be known to those skilled in the art. In one embodiment, the patterned mask layer 105 is a layer corresponding to a desired gate pattern.

Figure 1B:
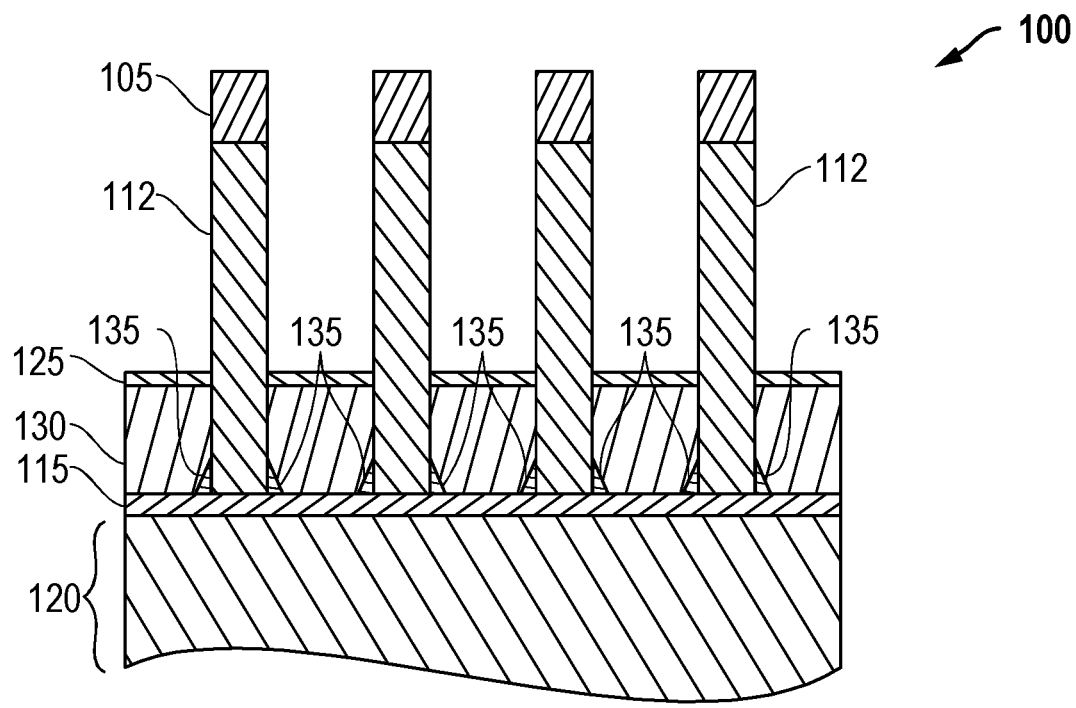
Figure 1C:
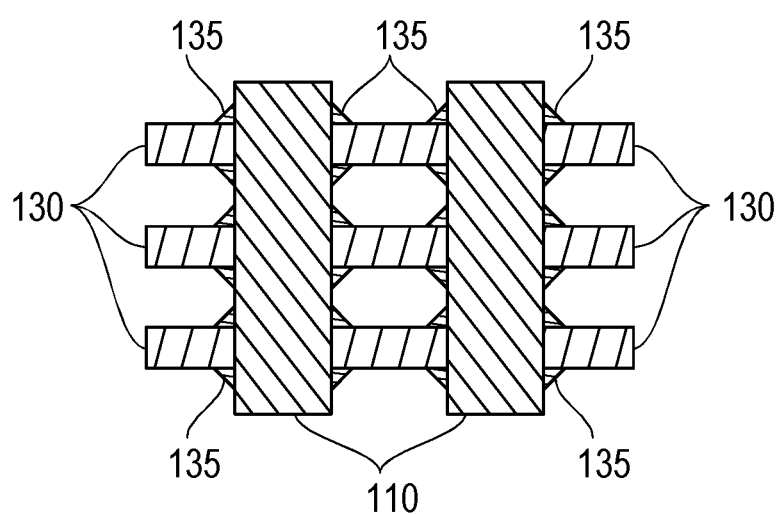

The layers of the substrate structure 200 may be similar to those of substrate structure 100 of FIG. 1A-1C except for the inclusion of a $Si_{1-x}Ge_x$ layer 205 which forms a bottom layer of the FinFET gate under the main gate layer 210 (for example a silicon layer). Thus, as shown in FIG. 2A, the FinFET gate material may be comprised of at least two materials, a bottom layer being a different material than the main gate layer. Having a gate with different layers formed of different materials provides the advantages described in more detail below. Then as shown in FIG. 2B, the substrate structure may be subjected to a gate etch process. As shown, the gate etch process etches both the $Si_{1-x}Ge_x$ layer 205 and the main gate layer 210 to provide the FinFET gate structure, utilizing the etch stop layer 115 as an etch stop. In this manner, a gate structure having an upper gate layer and a bottom gate layer is provided. The etch stop layer 115 may be an silicon oxide, silicon nitride, silicon oxy carbon nitride (SiOCN), silicon boron carbon nitride (SiBCN), or any other layer for which the gate etch process provides selectivity between the gate layers and the etch stop. It will be recognized that the etch stop layer may be formed of many other materials and that the particular material used may depend on what material the structure that is being etched is composed of. In one exemplary embodiment, the gate etch process may be a halogenated plasma etch process which will etch the $Si_{1-x}Ge_x$ layer 205 faster than a silicon main gate layer 210.

Similar to as described above in FIGS. 1B and 1C, after the gate etch the fin oxide 125 and fins 130 may now be seen (in a back depth of the plane of the figure) as shown in FIG. 2B. As can be seen from FIG. 2B, the resulting FinFET gate is provided without residual material at the base of the gate. The lack of residual material occurs due to the preferential removal rates of the $Si_{1-x}Ge_x$ layer 205 versus a silicon main gate layer 210 which lessens the likelihood of the formation of residues. Because of the etch rate differences, $Si_{1-x}Ge_x$ may be completely removed without compromising the sidewalls or critical dimensions of the FinFET gate. It will be recognized by those in skilled in the art that additional intervening layers may exist between the various layers shown in FIGS. 2A-2B (and similarly FIGS. 3A-3D) depending upon the particular substrate process flow within which the disclosed concepts are utilized. Thus, the particular layers shown are not meant to be limited but rather merely exemplary.

The concepts described herein are not limited to specific thickness and sizes of the various layers and features shown. In one embodiment, the total gate structure height may be in a range of 30 nm to 200 nm, the gate length may be in the range of 5 nm to 100 nm and the gate structure spaces may be in the range of 5 nm to 50 nm. The $Si_{1-x}Ge_x$ layer 205 component of the gate height may be less than 50 nm thick and more specifically between around 5 nm and 20 nm in height. In one embodiment, the $Si_{1-x}Ge_x$ layer 205 height may be around 10 nm thick. In one embodiment, the $Si_{1-x}Ge_x$ layer 205 may be formed by an epitaxial growth process on the underlying layer(s) 120 (for example the underlying layer(s) 120 may merely be a silicon base material or other material conducive for performing an epitaxial growth process on). The silicon of the main gate layer 210 may, in one embodiment, also be formed through an epitaxial growth process or in another embodiment may be deposited by a chemical vapor deposition process. It will be recognized, however, that the concepts described herein are not limited to a particular method of forming the various layers that form the gate.

Figure 3A:
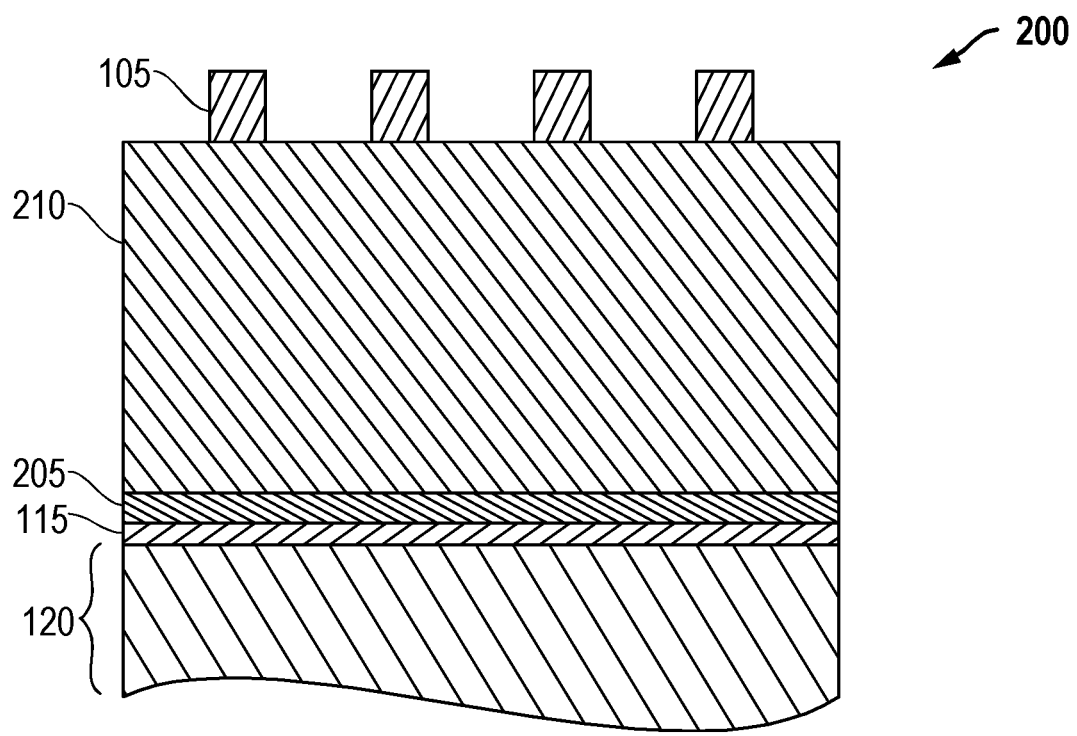
FIGS. 3A-3D illustrate another embodiment of a FinFET gate formation process utilizing the techniques disclosed herein.

FIGS. 3A-3D illustrate another embodiment of the concepts disclosed herein. The embodiment of FIGS. 3A-3D may utilize the concepts disclosed with regards to FIGS. 2A-2B above, with the addition of an oxidation process and oxide removal process. As shown in FIG. 3A, the substrate structure 200 is the same as that described above in FIG. 2A.

Figure 3B:
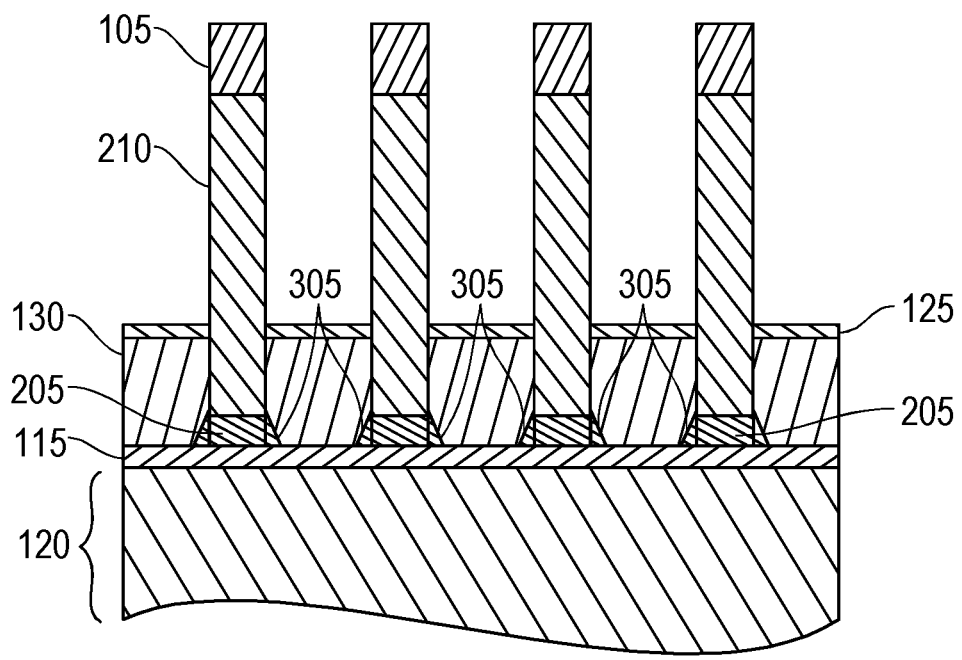
Figure 3C:
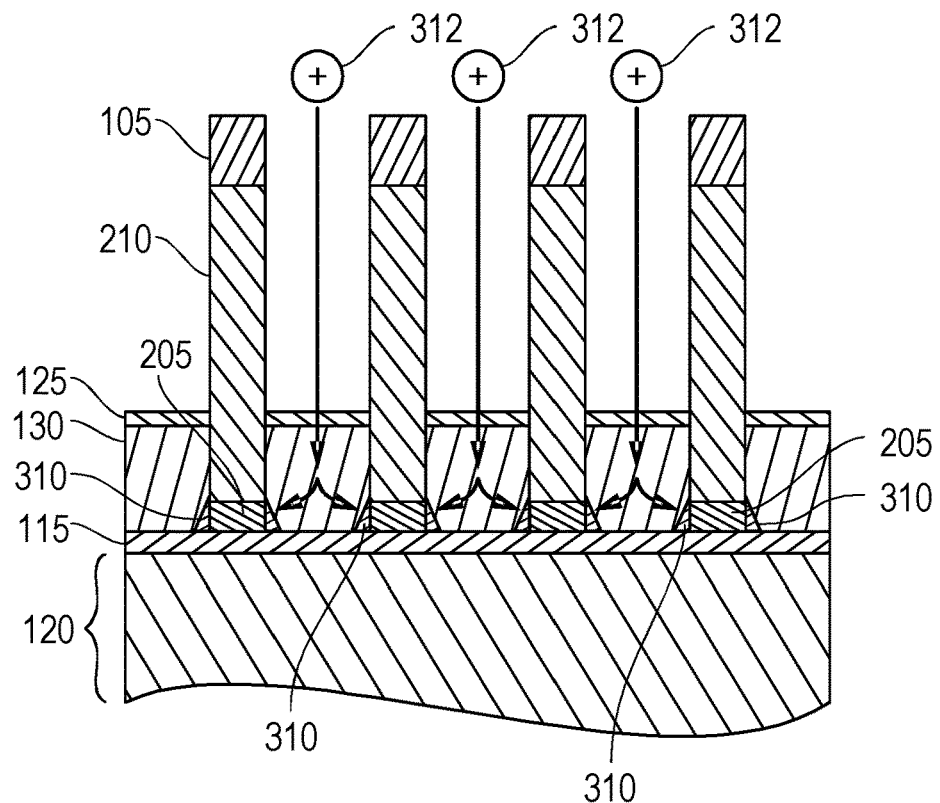
Figure 3D:
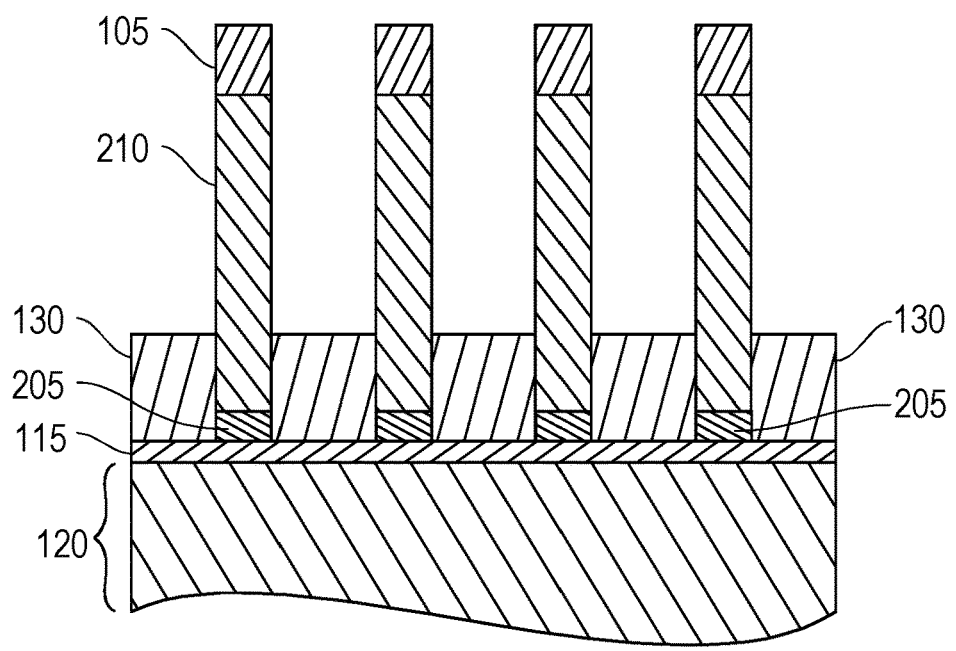

FIG. 3B illustrates the substrate structure after performing the gate etch process. In this example, the difference from the FIG. 2B example is that, in the FIG. 3B embodiment, some $Si_{1-x}Ge_x$ residuals 305 of the $Si_{1-x}Ge_x$ layer 205 remain after the gate etch process. Next, the structure is subjected to plasma oxidation process as indicated in FIG. 3C. As shown in FIG. 3C, ions 312 from an oxygen plasma will preferentially penetrate the non-vertical $Si_{1-x}Ge_x$ residuals 305 at the bottom regions of the gate converting the $Si_{1-x}Ge_x$ residuals 305 to oxide compounds, specifically a $Si_{1-x}Ge_xO_z$ oxide complex 310 as shown in the figure which may be a mixture of SiO and GeO compounds. In this manner, oxidizing the residues occurs. Then, the structure of FIG. 3C may be subjected to an oxide etch for removing the $Si_{1-x}Ge_xO_z$ oxide complex 310 to yield the structure shown in FIG. 3D. It will be noted that the structure of FIG. 3D is similar to that of the structure of FIG. 2D, except in FIG. 3D the fin oxide 125 has been removed by the oxide etch (depending upon the fin oxide thickness and the amount of oxide etch, the fin oxide 125 may merely be thinned rather than completely removed as shown in FIG. 3D). The oxide etch utilized to remove the $Si_{1-x}Ge_xO_z$ oxide complex 310 may, in one embodiment, be a wet oxide etch. More specifically, a diluted hydrofluoric acid (HF) wet etch may be used. Such an etch is advantageous as diluted HF wet etches are well known in the art and commonly utilized in wide range of process steps for substrate processing. Alternatively, other wet etch techniques or dry etching techniques may also be used.

The embodiments of FIGS. 2A-2B and FIGS. 3A-3D are shown with regard to embodiments in which the bottom $Si_{1-x}Ge_x$ layer 205 aligns with the main gate layer 210 without any undercut of the $Si_{1-x}Ge_x$ layer 205. However, it will be recognized that other embodiments may also be used. In particular, an embodiment may be provided in which the $Si_{1-x}Ge_x$ layer 205 is undercut underneath the main gate layer 210. For example, by extending the gate etch of FIG. 2B, extending the oxidation step of FIG. 3C, and/or extending the oxidation removal step of FIG. 3D, the $Si_{1-x}Ge_x$ layer 205 may be provided in a manner that the $Si_{1-x}Ge_x$ layer 205 is undercut relative to the main gate layer 210. In one embodiment, the undercut may be achieved by adding a pure chemical etching process after the processing of FIGS. 2B and 3D where the chemical etch selectively etches the $Si_{1-x}Ge_x$ layer 205 relative to the main gate layer 210. In another embodiment, the added step may be an atomic etch using fluorine such as a high pressure nitrogen trifluoride ($NF_3$) or fluorocarbon plasma etch. In this this manner, the dimension (left to right in the figures as shown) of the $Si_{1-x}Ge_x$ layer 205 may be less than that of the main gate layer 210 atop the $Si_{1-x}Ge_x$ layer 205 to provide a gate structure that has an undercut at the base of the gate.

The various etch, oxidation, and oxidation removal steps described above may be performed in accordance with a wide variety of processes. In one embodiment, a plasma gate etch is utilized, a plasma oxidation process is utilized and a wet oxide removal step is utilized. These steps are described in more detail below, however, it will be recognized that the specific processes are merely exemplary. Further, the various steps are not limited to even the particular type of process and thus the etch and oxidation steps are not even limited to plasma processes and the oxide removal step is not limited to wet processes.

In one embodiment, the gate etch step may be a halogen based plasma etch. Such etches are well known in the art for etching a variety of materials including silicon. Such etches are advantageous in that enhanced etching of $Si_{1-x}Ge_x$ occurs as compared to silicon. In one embodiment, a low pressure plasma etch using chlorine and argon gases may be used. For example, a plasma gate etch having a pressure of 10 millitorr (mTorr), a radio frequency (RF) power of 300 Watts, chlorine gas flows of 60-90 standard cubic centimeter per minute (SCCM), and argon gas flows of 60-105 SCCM may be utilized.

The plasma oxidation of the residues may advantageous utilize directional bombardment of oxygen ions to preferentially oxidize the residues and the bottom areas between gates as opposed to the gate sidewalls. Such techniques are desirable so that the oxidation process does not negatively impact the gate critical dimensions and profiles. The relative thicknesses of the oxidation on the sidewall surfaces and the bottom surfaces (such as the residues) may be dependent upon the fluence of the implanted ions (ion flux times process time) and the ion penetration depth. The fluence of the implanted ions may be dependent upon the ion/radical ($n_i/n_n$) density which is impacted by the plasma source power, pressure, gas ratios, etc. The ion energy depth generally depends upon the ion energy, $E_i$ which is impacted by plasma bias power and pressure. More specifically, the oxygen plasma may be biased to provide O+ ions which will bombard the substrate resulting in implantation of the ions to form an oxide. For a given ion energy, the depth of ion implantation is much higher for ions that are incident normally to a given surface (e.g. ions that bombard the residues and the bottom surfaces between the gates) and the ion implantation depth is more shallow for near grazing incident angles such as on vertical or near vertical sidewalls. The oxidation thicknesses will be related to these ion implantation depths. Thus, oxidation of the residue and the bottom surfaces is greater as they present horizontal surfaces (near normal ion incidence) as compared to sidewall surfaces which are vertical or near vertical surfaces (grazing ion incidence).

In one embodiment, the plasma oxidation process may be a plasma process having a pressure of 25 mTorr, oxygen gas flows between 20-80 SCCM, argon gas flows between 60-240 SCCM and an RF power of 300 W. In generally, the preferential oxidation of the bottom areas versus the sidewalls (more oxidation of residues and the etch stop layer desirable, less oxidation of sidewalls desirable) is improved with lower pressures (low pressures allowing more directionality) and higher power settings (high power providing higher ion energy).

As mentioned, the oxidized residues may then be removed with an oxide etch. Wet or dry etches may be utilized for this step. As described above, a wet etch may be desirable for ease of manufacturing and performance. A variety of wet oxide etches are well known in the art including a diluted HF etch, buffered oxide etch (BOE), etc. In one embodiment, a diluted HF etch of approximately 15 seconds may provide the desired removal effects.

In an another embodiment, an alternative oxidation and removal process provided as compared to the process described above with regard to FIGS. 3A-3D. More specifically, in the alternative oxidation and removal process the oxidation process utilized need not preferentially oxidized the $Si_{1-x}Ge_x$ residuals 305, rather standard oxidation processes may be utilized. An alternative removal process, in this case a preferential oxide removal process, however, allows the advantages of the techniques described above to still be obtained. In this alternative approach, any of a wide variety of well-known typical oxidation processes may be utilized. In such non-preferential processes, both the $Si_{1-x}Ge_x$ residuals 305 and the sidewalls of the main gate layer 210 may be oxidized. For example, with a main gate layer 21—formed of silicon and the $Si_{1-x}Ge_x$ residuals 305, a standard oxidation may provide both silicon oxide on the sidewalls of the main gate layer 21 and the $Si_{1-x}Ge_xO_z$ oxide complex 310.

Then, a preferential oxide removal process may be utilized such that the $Si_{1-x}Ge_xO_z$ oxide complex 310 is preferentially removed as compared to the oxide formed on the sidewalls of the main gate layer 210. In this manner, residuals at the bottom of the gate structure may be removed. Any preferential oxide removal process may be suitable in which the oxide complex formed from the residuals is removed at a higher rate than the oxides on the sidewalls of the main gate layer 210. One example preferential removal process is a sublimation process. The sublimation technique can advantageously utilize the characteristics that the oxides of the differing materials (for example $Si_{1-x}Ge_xO_z$ oxide versus silicon oxide) may sublimate at different rates for a given sublimation temperature. Thus, for example, the $Si_{1-x}Ge_xO_z$ oxide complex will be preferentially removed with a higher removal rate at a given sublimation temperature than the silicon oxide. Any of a wide variety of sublimation processes may be utilized. In one example that is merely exemplary, the sublimation process may employ a temperature of 405 degrees Celsius, in an inert gas atmosphere, and a pressure of from 1 mTorr to 760 Torr. Such conditions would sublimate the $Si_{1-x}Ge_xO_z$ oxide complex but not the silicon oxide. It will be recognized that such variables are merely exemplary and a wide range of these variable may be utilized and a wide range of other sublimation processes may be utilized.

As discussed above, a bottom layer of the exemplary gate structure is provided which is different from the main gate layer. Desirable properties of the bottom layer may be different enhanced plasma etch rates as compared to the main gate layer(s), ability to be oxidized, and/or ability to be removed after oxidation. The bottom layer need not necessarily provide each of such advantages though. The use of a $Si_{1-x}Ge_x$ layer with a silicon main gate layer, however, provides for each of such advantages. The $Si_{1-x}Ge_x$ layer may be etched at a higher rate than the silicon in halogen based etches, the $Si_{1-x}Ge_x$ residues may be more easily oxidized then silicon, and the resulting oxidation product may be easily removed. Thus, a $Si_{1-x}Ge_x$ provides advantages whether a process flow such as used in FIGS. 2A-2B or FIGS. 3A-3D is utilized.

In addition to the various process etch, oxidation and removable variables discussed above, the control of the process described herein may be adjusted by adjusting the bottom gate layer thickness and the content of the bottom layer. Thus, the techniques described herein provide additional process "control knobs" through adjusting the bottom gate layer thickness and ratios of the elements of that layer. As mentioned above, a relatively thin layer of $Si_{1-x}Ge_x$ (less than 50 nm and in one embodiment between 5-20 nm) may be sufficient. Generally, increased germanium provides better etch and oxidation characteristics for the steps described above. Exemplary ratios of the $Si_{1-x}Ge_x$ may be ratios of silicon to germanium of 0<X1 more preferably in a range of 0.1<X<0.4.

The concepts described herein may be utilized with a wide variety of structures and are not limited merely to a FinFET gate structure. Rather, the concepts may be utilized in a wide range of substrate process flows in which the prevention, minimizing, and/or removal of residual material may desired at the base of a feature. The techniques are particularly advantageous for narrow, high aspect ratio features which are more prone to complications caused by residual material.

The substrates utilized with the techniques disclosed herein may be any substrates for which the patterning of material is desirable. For example, in one embodiment, the substrate may be a semiconductor substrate having one or more semiconductor processing layers (all of which together may comprise the substrate) formed thereon. In one embodiment, the substrate may be a substrate that has been subject to multiple semiconductor processing steps which yield a wide variety of structures and layers, all of which are known in the substrate processing art. In one embodiment, the substrate may be a semiconductor wafer including the various structures and layers formed. Further, though the techniques described herein are described in relation to the formation of a silicon structure, and more particularly a silicon gate, it will be recognized that the techniques described herein may be used with other gate materials known in the substrate processing art.

Figure 4:
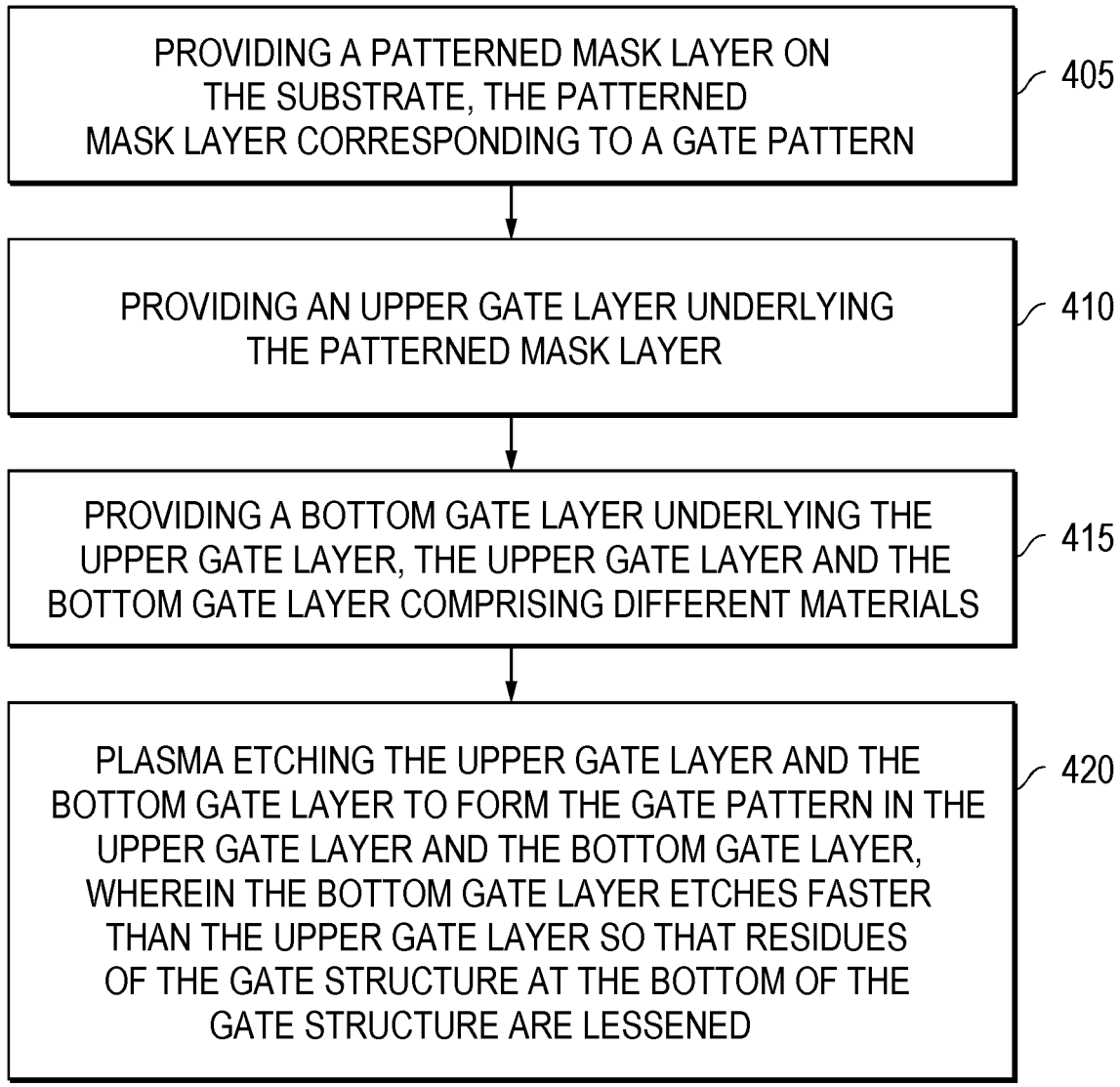
FIGS. 4 and 5 illustrate exemplary methods of utilizing the techniques disclosed herein.
Figure 5:
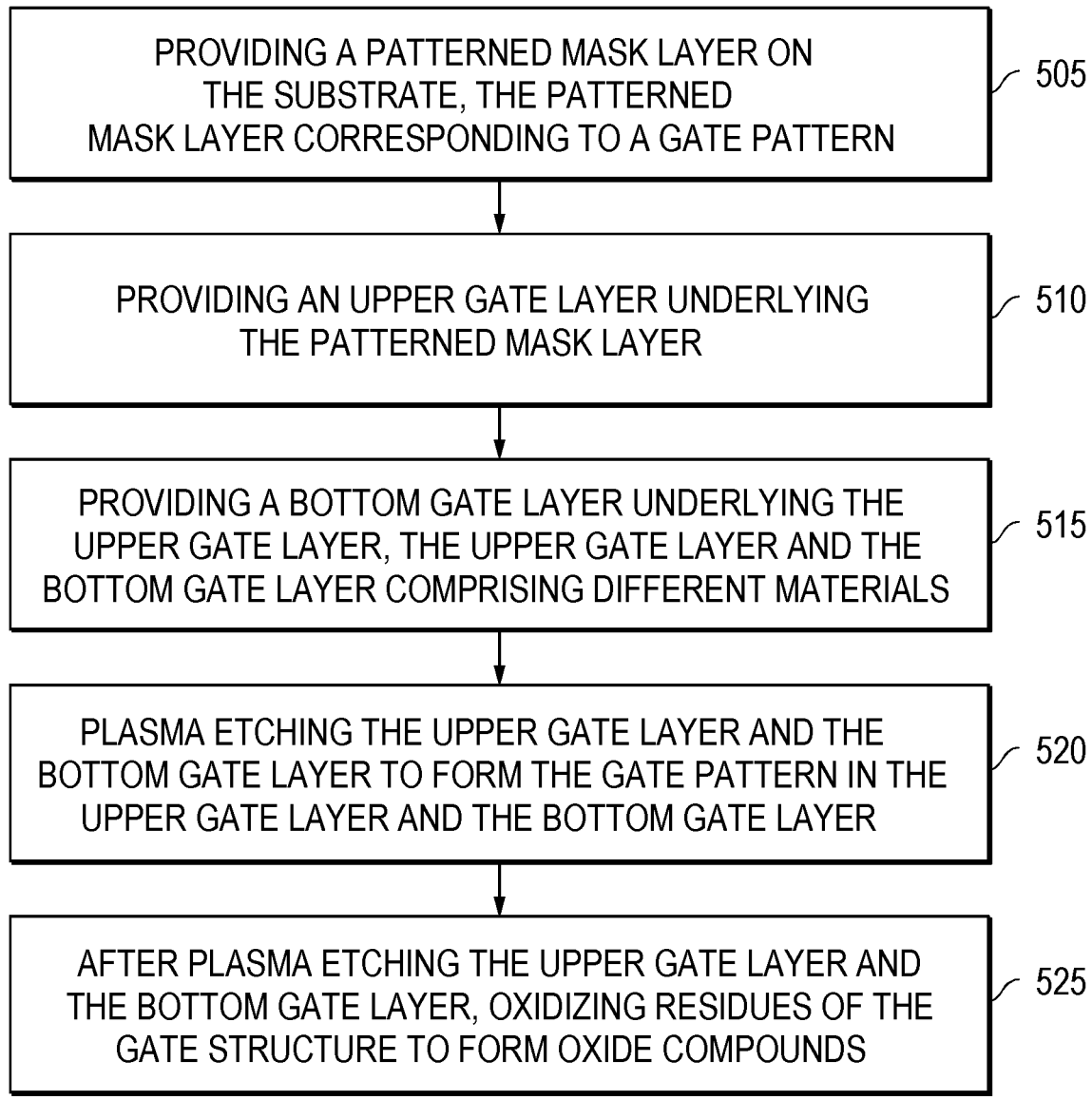

It will be recognized that the applications described above are merely exemplary, and many other processes and applications may advantageously utilize the techniques disclosed herein. FIGS. 4-5 illustrate exemplary methods for use of the processing techniques described herein. It will be recognized that the embodiments of FIGS. 4-5 are merely exemplary and additional methods may utilize the techniques described herein. Further, additional processing steps may be added to the methods shown in the FIGS. 4-5 as the steps described are not intended to be exclusive. Moreover, the order of the steps is not limited to the order shown in the figures as different orders may occur and/or various steps may be performed in combination or at the same time.

In FIG. 4, a method of patterning a gate structure on a substrate is shown. The method includes step 405 of providing a patterned mask layer on the substrate, the patterned mask layer corresponding to a gate pattern. The method also includes step 410 of providing an upper gate layer underlying the patterned mask layer and step 415 of providing a bottom gate layer underlying the upper gate layer, the upper gate layer and the bottom gate layer comprising different materials. The method further includes step 420 of plasma etching the upper gate layer and the bottom gate layer to form the gate pattern in the upper gate layer and the bottom gate layer, wherein the bottom gate layer etches faster than the upper gate layer so that residues of the gate structure at the bottom of the gate structure are lessened.

In FIG. 5, a method of patterning a gate structure on a substrate is shown. The method includes step 505 of providing a patterned mask layer on the substrate, the patterned mask layer corresponding to a gate pattern. The method also includes step 510 of providing an upper gate layer underlying the patterned mask layer and step 515 of providing a bottom gate layer underlying the upper gate layer, the upper gate layer and the bottom gate layer comprising different materials. The method further includes step 520 of plasma etching the upper gate layer and the bottom gate layer to form the gate pattern in the upper gate layer and the bottom gate layer. The method also includes step 525 of, after plasma etching the upper gate layer and the bottom gate layer, oxidizing residues of the gate structure with to form oxide compounds.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and method of the inventions herein shown and described are to be taken as presently preferred embodiments. Equivalent techniques may be substituted for those illustrated and described herein and certain features of the inventions may be utilized independently of the use of other features, all as would be apparent to one skilled in the art after having the benefit of this description of the inventions.

What is claimed is:

1. A method of patterning a gate structure on a substrate, the method comprising:
    providing a patterned mask layer on the substrate, the patterned mask layer corresponding to a gate pattern;
    providing an upper gate layer underlying the patterned mask layer, the upper gate layer comprising silicon;
    providing a bottom gate layer underlying the upper gate layer, the bottom gate layer comprising silicon germanium ($Si_{1-x}Ge_x$), wherein a ratio of silicon to germanium in the $Si_{1-x}Ge_x$ is $0.1<X<0.4$;
    plasma etching the upper gate layer and the bottom gate layer with a halogen-based plasma to form the gate pattern in the upper gate layer and the bottom gate layer and form the gate structure, wherein the halogen-based plasma etches the bottom gate layer faster than the upper gate layer to reduce formation of silicon germanium residues near a bottom of the gate structure; and
    after plasma etching the upper gate layer and the bottom gate layer, oxidizing the upper gate layer and the bottom gate layer to: (a) oxidize sidewall surfaces of the gate structure to form a sidewall oxide on the sidewall surfaces of the gate structure, and (b) oxidize any silicon germanium residues formed during the plasma etching to form oxide compounds near the bottom of the gate structure, the oxide compounds comprising a silicon germanium oxide ($Si_{1-x}Ge_xO_z$) complex;
    wherein said oxidizing preferentially oxidizes the silicon germanium residues formed near the bottom of the gate structure as opposed to oxidizing the sidewall surfaces of the gate structure.

2. The method of claim 1, wherein the gate structure is a fin field effect transistor (FinFET) gate.

3. The method of claim 1, wherein the ratio of silicon to germanium in the silicon germanium ($Si_{1-x}Ge_x$) enables: (a) the halogen-based plasma to etch the bottom gate layer faster than the upper gate layer to reduce the formation of the silicon germanium residues near the bottom of the gate structure, and (b) said oxidizing to preferentially oxidize the silicon germanium residues formed near the bottom of the gate structure as opposed to oxidizing the sidewall surfaces of the gate structure.

4. The method of claim 3, wherein the bottom gate layer is thinner compared to the upper gate layer after the plasma etching of the upper gate layer and the bottom gate layer.

5. The method of claim 1, further comprising removing the oxide compounds formed near the bottom of the gate structure.

6. The method of claim 5, wherein the oxide compounds are removed with a wet etch.

7. The method of claim 1, further comprising utilizing directional bombardment of oxygen ions to preferentially oxidize the silicon germanium residues formed near the bottom of the gate structure as opposed to oxidizing the sidewall surfaces of the gate structure.

8. The method of claim 1, further comprising preferentially removing the oxide compounds formed near the bottom of the gate structure as opposed to the sidewall oxide formed on the sidewall surfaces of the gate structure.

9. The method of claim 7, wherein a sublimation process is used to preferentially remove the oxide compounds at a higher removal rate than the sidewall oxide is removed.

10. The method of claim 9, wherein conditions used during the sublimation process sublimate the silicon germanium oxide ($Si_{1-x}Ge_xO_z$) complex without sublimating the sidewall oxide.

* * * * *